United States Patent
Bannikov et al.

(10) Patent No.: US 11,753,918 B2
(45) Date of Patent: Sep. 12, 2023

(54) METHOD FOR MULTILAYER HYDRAULIC FRACTURING TREATMENT WITH REAL-TIME ADJUSTING

(71) Applicant: SCHLUMBERGER TECHNOLOGY CORPORATION, Sugar Land, TX (US)

(72) Inventors: Denis Viktorovich Bannikov, Novosibirsk (RU); Ivan Anatolyevich Tsygulev, Moscow (RU); Ivan Vladimirovich Velikanov, Novosibirsk (RU)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 294 days.

(21) Appl. No.: 17/299,917

(22) PCT Filed: Dec. 6, 2018

(86) PCT No.: PCT/RU2018/000787
§ 371 (c)(1),
(2) Date: Jun. 4, 2021

(87) PCT Pub. No.: WO2020/117085
PCT Pub. Date: Jun. 11, 2020

(65) Prior Publication Data
US 2022/0082004 A1 Mar. 17, 2022

(51) Int. Cl.
*E21B 43/267* (2006.01)
*E21B 47/06* (2012.01)
(Continued)

(52) U.S. Cl.
CPC ............ *E21B 43/267* (2013.01); *E21B 47/06* (2013.01); *G01V 99/005* (2013.01); *E21B 2200/20* (2020.05); *G06F 30/20* (2020.01)

(58) Field of Classification Search
CPC .......... E21B 43/26; E21B 47/06; E21B 49/00; E21B 43/267; E21B 49/008; E21B 2200/20; G01V 2210/1234; G01V 99/005
See application file for complete search history.

(56) References Cited

U.S. PATENT DOCUMENTS

| 4,802,144 A | 1/1989 | Holzhausen et al. |
| 5,081,613 A | 1/1992 | Holzhausen et al. |

(Continued)

FOREIGN PATENT DOCUMENTS

| CN | 1690359 A | 11/2005 |
| CN | 101878351 A | 11/2010 |

(Continued)

OTHER PUBLICATIONS

Office Action issued in Chinese Patent Application No. 2018801006406 dated Jan. 20, 2023; 9 pages (with English translation).

(Continued)

*Primary Examiner* — Zakiya W Bates (57) ABSTRACT

Methods include designing and performing hydraulic fracturing treatments that utilize tube wave analysis by a combination of a flow rate splitting simulator and a multilayer fracturing (MLF) simulator to optimize treatment design parameters. Methods may also be directed to monitoring, controlling, evaluating and improving hydraulic fracturing treatments in real-time.

10 Claims, 7 Drawing Sheets

(51) Int. Cl.
*G01V 99/00* (2009.01)
*G06F 30/20* (2020.01)

(56) References Cited

U.S. PATENT DOCUMENTS

| | | |
|---|---|---|
| 5,093,811 A | 3/1992 | Mellor et al. |
| 5,170,378 A | 12/1992 | Mellor et al. |
| 5,206,836 A | 4/1993 | Holzhausen et al. |
| 6,724,687 B1 | 4/2004 | Stephenson et al. |
| 7,063,147 B2 | 6/2006 | Siebrits et al. |
| 7,451,812 B2 | 11/2008 | Cooper et al. |
| 7,580,796 B2 | 8/2009 | Soliman et al. |
| 7,908,230 B2 | 3/2011 | Bailey et al. |
| 8,635,907 B2 | 1/2014 | Bakulin |
| 8,950,482 B2 | 2/2015 | Hill et al. |
| 9,103,203 B2 | 8/2015 | Miller et al. |
| 9,476,760 B2 | 10/2016 | Brady et al. |
| 9,617,848 B2 | 4/2017 | Hill et al. |
| 9,658,357 B2 | 5/2017 | Kabannik et al. |
| 10,240,444 B2 | 3/2019 | Gumarov et al. |
| 2008/0239872 A1 | 10/2008 | Miller et al. |
| 2009/0159272 A1 | 6/2009 | Auzerais et al. |
| 2011/0120706 A1 | 5/2011 | Craig |
| 2014/0151035 A1 | 6/2014 | Cohen et al. |
| 2016/0178798 A1 | 6/2016 | Holland et al. |
| 2016/0357883 A1 | 12/2016 | Weng et al. |
| 2018/0094521 A1* | 4/2018 | Adamopoulos ......... E21B 47/18 |

FOREIGN PATENT DOCUMENTS

| | | |
|---|---|---|
| CN | 103827441 A | 5/2014 |
| CN | 104204407 A | 12/2014 |
| CN | 104295290 A | 1/2015 |
| CN | 107524432 A | 12/2017 |
| RU | 2649195 C1 | 3/2018 |
| WO | 2015003028 A1 | 1/2015 |

OTHER PUBLICATIONS

Wutherich et al., "Designing Completions in Horizontal Shale Gas Well—Perforation Strategies", SPE 155485, Society of Petroleum Engineers, 2012, 10 pages.

Search Report and Written Opinion of International Patent Application No. PCT/RU2018/000787 dated Aug. 8, 2019; 6 pages.

* cited by examiner

FIG. 7 and the appended claims.
METHOD FOR MULTILAYER HYDRAULIC FRACTURING TREATMENT WITH REAL-TIME ADJUSTING

BACKGROUND

Hydraulic fracturing is the method of well stimulation by generating fractures inside hydrocarbon-bearing formation by injecting fluid at the pressure higher than the breakdown pressure of the formation. Along with the fluid, proppant is also placed in the fracture to prevent the closure of the fracture when the pressure is released at the end of stimulation treatment. After the treatment is finished and the well is put into production, hydrocarbons flow from the formation to the wellbore through the generated fractures. The main objective of fracturing is to increase well productivity.

Unconventional resources, such as shale gas or shale oil, usually require massive multi-stage fracturing treatments in horizontal wells. Such fracturing technique allows maximizing wellbore coverage and reservoir contact. Fracturing jobs may be designed based on reservoir data, proppant, acid volume to be pumped, target productivity index of the well, and the like. However, uncertainties in reservoir characterization can introduce difficulties in designing and executing the effective hydraulic fracturing job to maximize the total amount of hydrocarbon recoverable from a given reservoir.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to methods for treating of subterranean formation that include: (1) selecting a wellbore for a multilayer hydraulic fracturing treatment, creating an initial job design for the multilayer hydraulic fracturing treatment, setting one or more fracturing job criterion, and generating a model of tube wave propagation in the wellbore based on the initial job design; (2) initiating a portion of the initial job design; (3) generating one or more tube waves in the wellbore and monitoring one or more reflections of the one or more tube waves, and calculating a number of open fractures and fracture geometry parameters with the model of tube wave propagation; (4) performing real-time evaluation of the fracture geometry parameters by: estimating one or more pumping flow rates into the number of open fractures; and simulating a fracturing process for the number of open fractures using a multilayer fracturing simulator; (5) adjusting the multilayer fracturing simulator until the number of open fractures, one or more pumping flow rates, and fracture geometry parameters from stage (3) coincide with the real-time evaluation of the fracture geometry parameters from stage (4) to generate an adjusted hydraulic fracturing simulator; (6) calculating the fracture geometry parameters with the adjusted hydraulic fracturing simulator to generate a measured (on-line monitored) job design. Then we (7) calculate the difference between the initial job design and the measured job design; and (8) perform one of: verifying that the difference from stage (7) is below an assigned variance for the one or more fracturing job criterion and continue the initial job design; or update the initial job design and repeat stages (6) and (7) until the difference from stage (7) is below the assigned variance for the one or more fracturing job criterion and continue with an update of the initial job design; and (9) repeat stages (3) to (8) until the multilayer hydraulic fracturing treatment is completed. This allows to promptly change the job design with achieving of key job criterions without halting of fracturing operation.

Other aspects and advantages of the claimed subject matter will be apparent from the following description and the appended claims.

DETAILED DESCRIPTION

In one aspect, embodiments disclosed herein relate to methods of designing and performing hydraulic fracturing treatments that utilize tube wave analysis by a combination of a flow rate splitting simulator and a multilayer fracturing (MLF) simulator to optimize treatment design parameters. As used herein, "tube wave" is periodic pressure disturbance in which alternating compression and rarefaction are propagated through or on the surface of a medium without translation of the material; also known as a pressure wave or Stoneley wave. In one or more embodiments, methods may be directed to monitoring, controlling, evaluating and improving hydraulic fracturing treatments in real-time. In some embodiments, methods may also include performing one or more remediation actions to modify a job design in real-time.

With the development of modeling, software, and hardware capacities, the ability to optimize designs before a job and in real-time has become more feasible. One cost effective method of fracturing treatment is multilayer fracturing that allows the creation of multiple fractures during one stage pumping. Design of fracturing treatments may include the implementation of multilayer fracturing simulators to model multiple fractures in real-time, which may also include algorithms for modeling flow rate splitting between fractures. However, such approaches are often based only on well logs and other initial measurements recorded during wellbore installation. The use of initial data results in unacceptably high measurement uncertainty that can limit the reliability of predictions of whether fractures are open or closed as injected fluid flows are split and redistributed within the wellbore. As a consequence, job designs may require remedial measures to correct issues such as the placement of proppants and other materials in fractures that impair conductivity and hydrocarbon production rate.

Methods in accordance with the present disclosure may be used to design fracturing treatments that may involve numerical models of hydraulic fracturing and acidizing, which can aid proppant placement without screenout (proppant bridging), and the attainment of the designed geometry and conductivity for fractures and/or wormholes. In one or more embodiments, methods may utilize tube wave analysis with a combination of a flow rate splitting simulator and MLF simulator to produce an inexpensive wireless approach for fracture open/close state detection that may be done intermittently or in real-time during a fracturing operation. In some embodiments, tube wave analysis may include monitoring tube waves reflected during a multilayer fracturing treatment in real-time.

Tube waves are interface waves that occur in cased wellbores when a Rayleigh wave encounters a wellbore and perturbs the fluid in the wellbore. The tube wave travels down the wellbore along the interface between the fluid in the wellbore and the wall of the wellbore. Because the tube wave is coupled to the formation through which it is traveling, it can perturb the formation across open fractures intersecting the borehole, creating a squeezing effect that generates secondary tube waves that are reflected up and down from the fracture location. Intercepted secondary tube waves may contain signatures diagnostic of open fractures and their amplitude related qualitatively to the length and width, e.g., volume of the fluid-filled fracture space, in addition to other characteristics such as fracture closure pressure, fracture initiation pressure, and the like. Tube waves may also be used to detect other features such as obstructions, pipe sections of different diameters, perforations, and open fractures.

In practice, secondary tube waves may be deconvolved from primary tube waves by identifying the time and magnitude of the peak value of the envelope of the deconvolved signal. This time and magnitude will vary in a predictable manner, and the variation can be analyzed as a function of depth. Advanced algorithms for tube wave processing (e.g., cepstrum analysis) together with pressure source control mechanisms, including pump noise, active pulse sources, and the like, may also be used to extract date from tube waves to resolve positions of multiple fractures from a wellbore. Examples of tube wave analysis are discussed in greater detail in U.S. Pat. No. 4,831,600.

In one or more some embodiments, methods may include the use of a rate splitting simulator to determine the amount of injected slurry flowing to each of the fractures during a fracturing operation, and a multilayer hydraulic fracturing simulator to determine the parameters of the produced fractures. In some embodiments, methods may also enable calibration of numerical model parameters to increase the match of simulated and acquired treatment-related data from real-time analysis of tube waves to optimize wellbore stimulation, including for wellbores containing multiple perforated clusters.

Multilayer Fracturing Design Optimization

Figure 1:
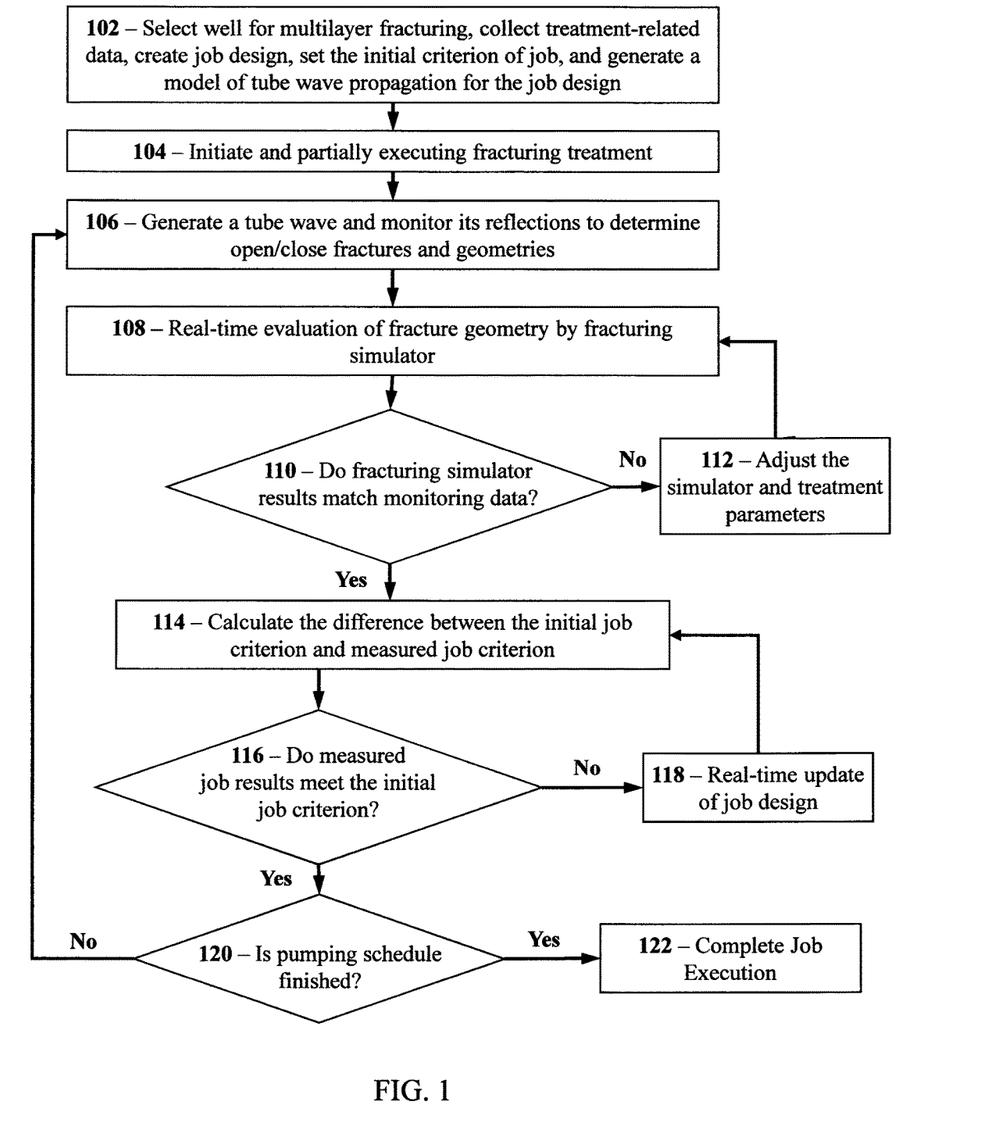
FIG. 1 is a flow diagram illustrating a fracturing treatment in accordance with embodiments of the present disclosure.

Multilayer fracturing operations in accordance with the present disclosure include the general steps of: selecting a candidate for a multilayer hydraulic fracturing treatment, collecting treatment-related data, and creating an initial job design that may be iteratively calibrated based on real-time data acquisition. FIG. 1 illustrates a general workflow for multilayer fracturing design optimization. Beginning at 102, the method proceeds by selecting a wellbore or formation for hydraulic fracturing treatment, collecting treatment-related data, creating an initial job design, setting the initial criterion for job execution and generating a model of tube wave propagation in the wellbore based on the initial job design.

Collected treatment data may include mineralogical information, stress profiles, Young's modulus, and leakoff for each formation under study. An initial job design for a fracturing treatment may include all standard parameters for hydraulic fracturing such as fluid compositions, pad fluid type, pad fractions, proppant schedules, pumping rates, recommended fracturing pressures, equipment types, zonal isolation (if needed), and the like.

Following initial job design, the job is "partially" executed by performing one stage of hydraulic fracturing treatment at 104 and the job performance in the wellbore is monitored by tube wave analysis at 106. Tube wave analysis at 106 includes generating one or more tube waves in the wellbore and monitoring one or more reflections of the one or more tube waves and calculating a number of open fractures and fracture geometry parameters based on a model of tube wave propagation.

At 108, optimization begins with real-time monitoring of tube wave reflections to determine the depth and/or the quantity of the open fractures in the wellbore, in addition to the associated pumping rates into the fractures. As fractures are monitored, the data is also analyzed using one or more algorithms that perform real-time evaluation of pumping rate splitting among open fractures in conjunction with a multilayer hydraulic fracturing simulator to determine the relevant fracture parameters. The fracture parameters obtained at 108 are analyzed at 110 to determine whether any error exists between the monitored tube waves at 106 and the fracturing simulator results from 108. Where there is an unacceptable level of error between the monitoring data and the fracturing simulator, the simulator is calibrated by adjusting treatment-related data and parameters of the fracturing simulator at 112.

Once the fracturing simulator is calibrated, the method moves to 114 where the variance between the measured data for the job criterion is compared to the job criterion set forth in the initial job design. In one or more embodiments, job criterion for a multilayer hydraulic fracturing treatment may include a set number of fractures for a given well or interval, a percentage of proppant emplaced, fracture lengths, pumping rates, and the like.

At 116, depending on the degree of variance between the measured job design and the initial job design, the job parameters may be modified by adjusting a number of variable such as pumping flow rate, proppant concentration, proppant size, fiber additives, fluid type, fluid additives amount, and the like, to decrease the variance for the respective job criterion.

Once the initial job criterion is satisfied, the method moves to 120 where the pumping schedule is resumed for the target well or wells and tube wave analysis continues at 106 or, if the pumping schedule is finished, job execution is completed and moves to the next stages of well construction.

While the optimization methods are discussed briefly above, each of the stages are discussed in greater detail in the following sections.

Monitoring Tube Wave Reflection in a Wellbore

Methods in accordance with the present disclosure include real-time monitoring of tube wave reflections generated in a wellbore to determine the depth and the quantity of open fractures capable of accepting a treatment fluid. In some embodiments, monitoring of reflected tube waves is performed by one or more distributed pressure sensors in the wellbore.

Figure 2:
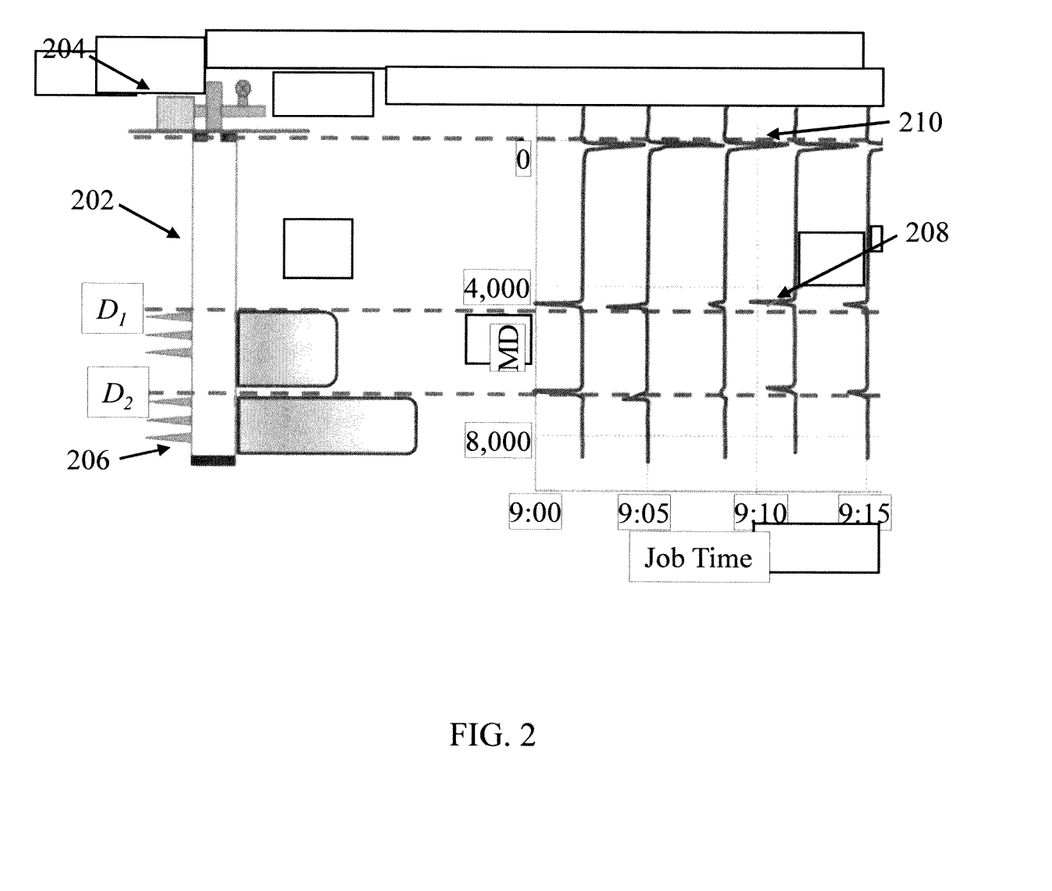
FIG. 2 is a diagram illustrating the detection of fractures in a wellbore through tube wave propagation in accordance with embodiments of the present disclosure.

FIG. 2 illustrates the determination of fracture state by tube wave analysis for an idealized cased well 202 treated with a multilayer fracturing treatment. Tube wave analysis is performed by modeling a slurry flow into the wellbore and calculating the flow rate distribution among one or more fractures. Petrophysical models may be used to calculate fracture parameters by inputting data sensed by tube wave reflections within the borehole, and using known physical relationships between geological properties, flow rates, injected fluid composition, and expected pressure responses to generate information regarding the location, number, length, and conductivity of fractures within a specified interval of a wellbore. Petrophysical models that may be used to perform tube wave analysis include models such as that discussed in U.S. Pat. No. 9,658,357 and the like. The measurement method comprises determining of microseismic event locations, generating low frequency pressure waves (tube waves) near the wellbore, recording of tube waves reflections from the fractures in real time and analyzing microseismic event locations and tube waves reflections from the fractures. U.S. Pat. No. 9,103,203 discloses the using of tube waves (acoustic disturbance) for estimating a property of a fluid-filled wellbore system. This is accomplished by recording data including at least one of pressure and rate of flow at one or more locations in the wellbore system, and then estimating the value of the property by employing a model for predicting at least one of pressure and rate of flow dependent upon characteristics and locations of disturbances to pressure and flow in the wellbore system, in order to determine a best prediction of some attribute of the recorded data.

During tube wave analysis, a pulsing source 204 generates a pressure wavelet s(t) as a continuous function of time t that traverse a wellbore containing several fractures 206. Fractures 206 have different hydraulic impedances compared to the surrounding media and serve as downhole reflectors, and pressure wavelet s(t) gives rise to a tube wave that propagates along the wellbore at a velocity of tube wave $V_{TW}$. The tube wave velocity distribution in a wellbore is not known in general and depends on a number of well-specific factors including wellbore geometry, elastic properties of the formation, and the elastic properties and density of any fluids present.

Each time the tube wave pulse meets fracture 206, part of it reflects while part of it propagates through. The wellhead pressure can be acquired as a discrete signal x(n) with the surface pressure gauge, where n is a sample number. Analysis of surface pressure signal x(n) allows to determine depths of open fractures. With particular respect to FIG. 2, an example of pulse response at measured depth as a function of time is shown. Analysis methods may be used to sharpen peaks within the data (a process known as deconvolution), and to correct dispersions (Q-filtering, for example) to aid the identification of fractures and other artifacts. Peaks 208 correlate with borehole reflectors, fractures in this case, at depths $D_1$ and $D_2$ from surface 210.

In the next step, a convolution model of the discrete pressure oscillation record x(n) is constructed. With particular respect to FIG. 3, the model x(n) shown in FIG. 3 at 302 is represented as convolution of the source wavelet s(t) 304 and the reflectivity of the wellbore w(n) 306. In one or more embodiments, a convolution model may be used to characterize tube wave propagation in a wellbore, which may also calculate wellbore reflectivity w(n). The wellbore reflectivity w(n) is the unknown parameter in the convolution equation x(n)=s(n)*w(n). Normally, the wellbore reflectivity w(n) is a decaying minimum-phase train of pulses delayed by the arrival times, while their amplitudes depend on corresponding reflection coefficients and wave attenuation in the wellbore. The reflection coefficients are determined by impedance changes at the reflection boundaries. Reflection coefficients are negative for hydraulic fractures, and positive for wellbore restrictions.

Figure 3:
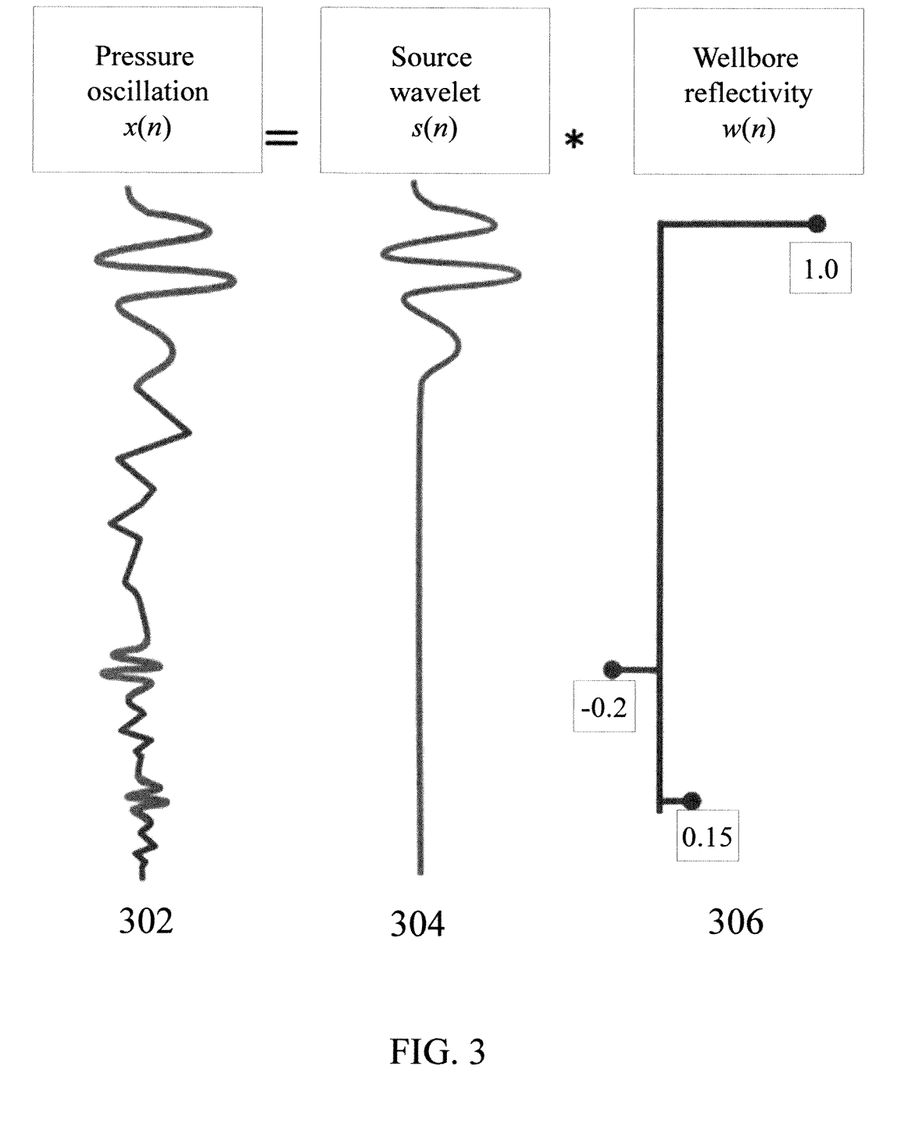
FIG. 3 is a graphical representation illustrating the deconvolution of tube wave pressure oscillations in accordance with embodiments of the present disclosure.

In one or more embodiments, the convolution equation can be solved by deconvolution operation in the time domain or by spectral division in the frequency domain. The depths and types of corresponding downhole reflectors are determined from the estimated wellbore reflectivity and tube wave velocity distribution along the wellbore.

Coupling Tube Wave Analysis with a Multilayer Fracturing Simulator in Real-Time

In one or more embodiments, methods may analyze the results of tube wave measurements in a wellbore using a combination of a flow rate splitting simulator and a MLF simulator to determine the parameters of a fracturing treatment being performed. By performing multiple measurements during the fracturing treatment, the job may be modified to address issues identified by the use of flow splitting and MLF models to avoid or minimize the need for remedial measures and maximize hydrocarbon recovery.

Calculation of Flow Rate Distribution Using a Flow Splitting Model

Methods in accordance with the present disclosure may use a flow splitting model to determine the flow rate distribution entering a multilayer fracture network. With particular respect to FIG. 4, a theoretical framework for a multilayer fracture treatment is shown. Fractures are generated in the rock in the vicinity of perforated intervals. The positions and the total number of open fractures n is determined by the tube waves monitoring. Each fracture grows depending on the flow rate pumped into it and the formation property around it. The total pumping rate Q is split into n fractures. A pressure $P_{ref}$ is applied from the surface to inject the slurry into the formation.

Figure 4:
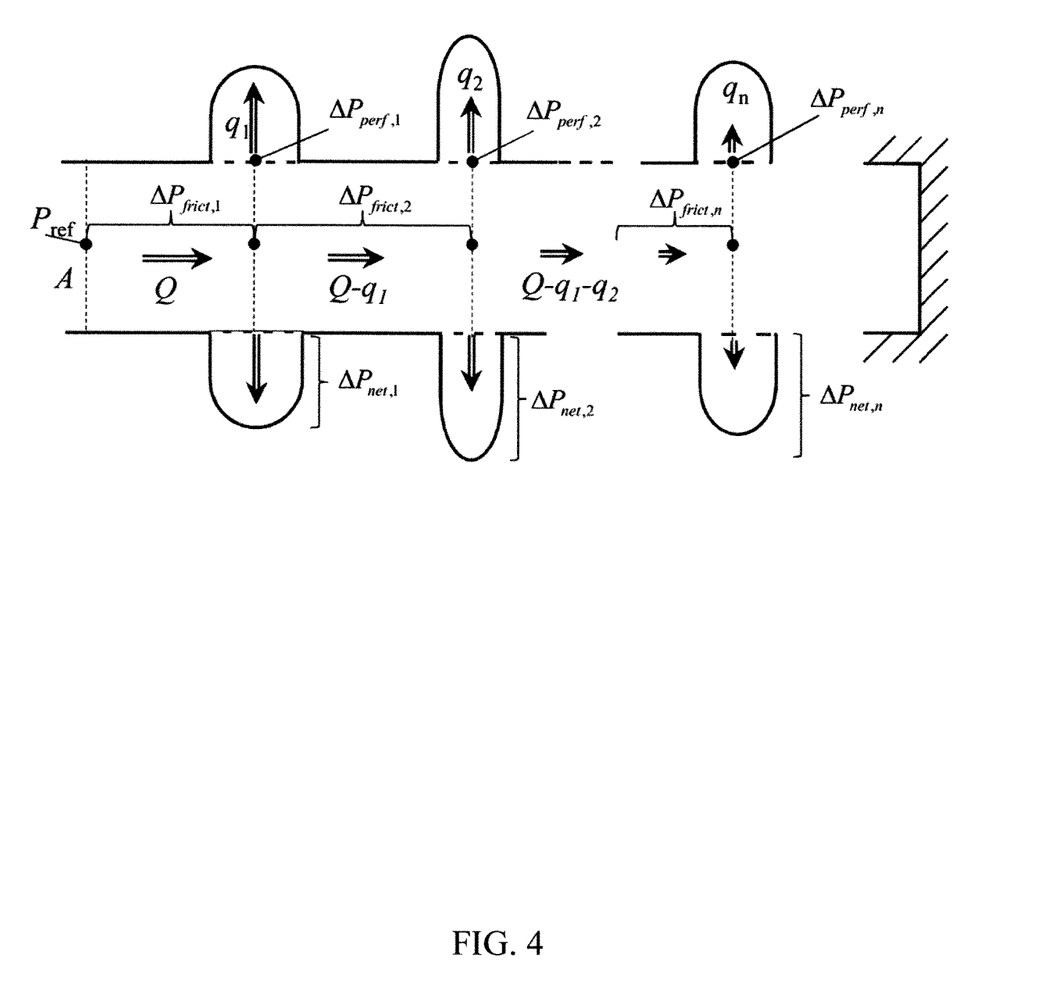
FIG. 4 is a diagram illustrating the theoretical framework for estimation of pumping rates splitting into a set of open fractures in accordance with embodiments of the present disclosure.

In one or more embodiments, algorithms for calculating flow rate distribution consider a number of effects, including: (1) casing friction, (2) hydrostatic forces, (3) perforation friction; and (4) the presence of fractures. Any other sources of pressure drops may be added in some embodiments.

The casing friction in a wellbore $\Delta P_{frict}$ is given by Eq. 1, where c the friction pressure coefficient, Q is the flow in the wellbore, d the friction pressure constant, and $\Delta L$ is the length of the wellbore element.

$$\Delta P_{frict} = c \cdot Q^d \cdot \Delta L \qquad (1)$$

The hydrostatic pressure drop $\Delta P_{hydr,i}$ is given by Eq. 2, where $\rho_{slurry}$ is the density of the treatment slurry, g is free fall acceleration, and $\Delta z_i$ is the height difference between reference point A and an i-th perforated interval.

$$\Delta P_{hydr,i} = \rho_{slurry} \cdot g \cdot \Delta z_i \qquad (2)$$

The perforation friction is given by Eq. 3, where $q_i$ is the flow in the i-th perforated interval, $m_i$ is number of perforations at i-th interval, $d_{perf}$ is diameter of perforations, and $C_d$ is perforation coefficient (0.56 for initial shape, 0.89 for final shape).

$$\Delta P_{perf,i} = 0.81 \frac{q_i^2 \rho_{slurry}}{m_i^2 d_{perf}^4 C_d^2} \qquad (3)$$

The algorithm couples an analytical model of a constant height Perkins-Kern-Nordgren (PKN) fracture to a set of equations describing conservation of slurry volume and pressure continuity. These equations provide coupling between multiple fractures via the wellbore. The net pressure $\Delta P_{net,i}$ corresponds to PKN fracture for zero leak-off case shown in Eq. 4, where $v$ is Poisson's ratio, $\mu$ is fluid viscosity, $E$ is Young's modulus, $h$ is fracture height, and $q_{frac}$ is the fluid flow in the fracture half-wing determined by Eq. 5.

$$\Delta P_{net,i} = 2.5 \left( \frac{2(1-v)^2 \mu q_{frac}^2}{Eh} t \right)^{1/5} \quad (4)$$

$$q_{frac} = \frac{q_i}{2} \quad (5)$$

While the PKN MLF simulator is used in the example above, it is envisioned that any other MLF simulator could be used to simulate net pressure caused by presence of the fracture such as a Khristianovich-Geertsma-de Klerk (KGD) model, a radial model, a pseudo 3D model, a planar 3D model, a full 3D model, and the like.

The primary assumptions in this algorithm are the absence of fluid transfer between the fractures within the formation. This assumption implies that the fractures are coupled only through the wellbore. Conservation of fluid volume gives the equality shown in Eq. 6.

$$Q = \sum_{k=1}^{n} q_i \quad (6)$$

Continuity of pressure implies that the sum of all pressure changes is equal to the reference pressure for any path connecting a fracture tip of the i-th fracture with the reference point A in FIG. 4, where $P_{closure,i}$ is the closure stress in layer i.

$$P_{ref} = \sum_{k=1}^{i} \Delta P_{frict,k} + \Delta P_{perf,i} - \Delta P_{hydr,i} + \Delta P_{net,i} + P_{closure,i}, i = 1, n \quad (7)$$

The solution to the system of non-linear equations (5)-(6) where $q_1, \ldots, q_n, P_{ref}$ are unknowns found by the application of a Newton-like method for nonlinear system of equations.

The flow splitting model is used to calculate flow rate distribution for each fracture within the wellbore and then analyzed further by the MLF simulator as the method proceeds. In one or more embodiments, the flow rate distribution among multiple fractures is calculated by modeling a slurry flow into the wellbore during real-time evaluation of fracture geometry parameters.

Calibrate Fracture Simulator with Measured Treatment Data Treatment

Following the establishment of a model based on the MLF simulator, the calculated rates $q_1, \ldots, q_n$ and reference pressure $P_{ref}$ are compared to measured treatment-related data. If the calculated data values vary from the measured data (often expressed as a percentage), the treatment-related parameters are modified until matching of simulated data and acquired data occurs.

Depending on the difference between the simulated results and the measured results, an MLF simulator may be adjusted until the number of open fractures, pumping flow rates, and fracture geometry parameters coincide within a preset percent error limit with respect to the real-time evaluation of the fracture geometry parameters obtained from tube wave analysis. For example, a method may include adjusting a MLF where the error is greater than 10% between the simulated results and the measured results from tube wave analysis. In one or more embodiments, the preset percent error limit may be a percentage selected from any one of 5%, 10%, 15%, and 20%. However depending on the application the error percentage limit may be more or less that the stated values.

Real-Time Job Analysis

Once the measured MLF simulator has been used to quantify the job progress, a measured job design, a selected fracturing job criterion may be used to judge the variance between the initial job design and the measured job design. Fracture job criterion may include fracture number, fracture length, proppant placement, fracture conductivity, and the like, and combinations thereof.

In one or more embodiments, an arbitrary variance limit for a selected job criterion may be set to notify a user whether a job design update is needed before continuing a multilayer hydraulic fracturing treatment. In one or more embodiments, the variance limit for a fracturing job criterion between the initial job design and the measured job design data values may be within a percentage selected from any one of 1%, 5%, 10%, 15%, and 20%, where a variance above the selected limit indicates a need to update the initial job design to account for the differences noted in the measured job design. However depending on the application the percentage of variance may be more or less that the stated values.

Real-Time Update of Job Design

In the event that measured fracturing job results do not match the criterion specified in the initial job design, one or more methods may be performed to update the current job design to meet the specified criterion. In one or more embodiments, updating a job design may include optimizing the job design in real-time through techniques such as changing one or more of pumping rate, proppant concentration, proppant type, proppant size, solid additives, fluid type, fluid additives, and the like.

Applications

In one or more embodiments, fracturing methods may be applied to a wellbore candidate that has not been fractured previously. In some embodiments, methods may include refracturing methods applied to wellbores that have been treated previously with a hydraulic fracturing treatment to produce stimulated clusters, and/or the addition of new perforations and fractures to a previously fractured well.

System Design

In one or more embodiments, methods in accordance with the present disclosure include an acquisition system based on monitoring of tube wave reflections in a wellbore to determine the size and/or location of one or more existing fractures. Acquisition systems in accordance with the present disclosure may include a pulsing source capable of generating tube waves within a wellbore being treated and one or more sensors distributed at various depths within the wellbore. In one or more embodiments, sensors may be configured alone or in an array of distributed sensors to monitor reflected tube waves in the wellbore. Methods of sensing pressure changes in a wellbore and equipment configurations are discussed, for example, in U.S. Pat. No. 9,476,760 "Precision measurements in a fiber optic distributed sensor system".

Sensors in accordance with the present disclosure may be capable of detecting and recording pressure, vibration, and/ or flow rate. Sensors may include any number and type of sensors suitable for downhole sensing changes in pressure and vibration such as quartz gauges, optics-based sensors including fiber optics, and the like. In one or more embodiments, sensors may include those selected from the WELL-WATCHER™ series of sensors, commercially available from Schlumberger Technology Corporation.

Computing System

Systems in accordance with the present disclosure are also configured to be operated by a computing system that organizes the system for operation by a user or autonomously to evaluate multilayer fractures in a subterranean formation. In one or more embodiments, methods may utilize a MLF simulator that solves for rate splitting among multiple fractures, simulates growth of hydraulic fractures in the formation layers, and determines various parameters of the fractures. Following treatment design by the simulators, treatment-related parameters may be calibrated in real-time, in addition to recommendations for remedial actions if necessary.

Figure 5:
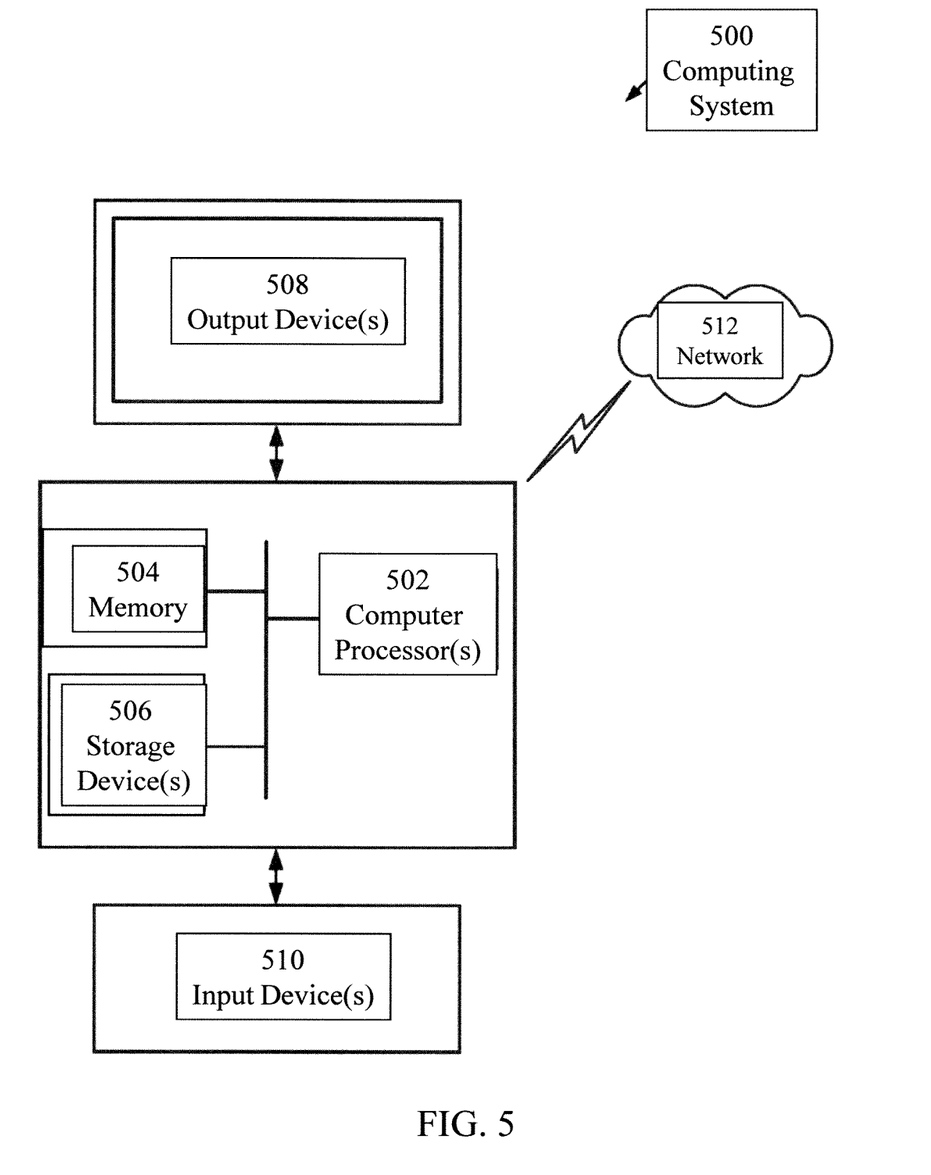
FIG. 5 is a schematic showing an example of a computer system for executing methods in accordance with the present disclosure.

Any combination of mobile, desktop, server, embedded, or other types of hardware may be used. For example, as shown in FIG. 5, the computing system (500) may include one or more computer processor(s) (502), associated memory (504) (e.g., random access memory (RAM), cache memory, flash memory, etc.), one or more storage device(s) (506) (e.g., a hard disk, an optical drive such as a compact disk (CD) drive or digital versatile disk (DVD) drive, a flash memory stick, etc.), and numerous other elements and functionalities. The computer processor(s) (502) may be an integrated circuit for processing instructions. For example, the computer processor(s) may be one or more cores, or micro-cores of a processor configured to perform methods described above, including obtaining a job design for a hydraulic fracturing treatment, providing instructions for execution of a portion of the hydraulic fracturing treatment, characterizing a degree of fracture propagation in the subterranean formation by monitoring tube wave reflection in a wellbore, determining whether the degree of fracture propagation matches the initial job design, and providing instructions for performing one of modifying the initial job design and repeating the prior steps until the degree of fracture propagation matches the initial job design; or completing the hydraulic fracturing treatment. Further, as may be understood from the present disclosure, characterizing the degree of fracturing propagation may include using a pulsing source to generate one or more tube waves in the wellbore; measuring one or more tube wave reflections in the wellbore; and determining at least one of a location or fracture width for one or more fractures within the subterranean formation.

The computing system (500) may also include one or more input device(s) (510), such as a touchscreen, keyboard, mouse, microphone, touchpad, electronic pen, or any other type of input device. Further, the computing system (500) may include one or more output device(s) (508), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (500) may be connected to a network (512) (e.g., a local area network (LAN), a wide area network (WAN) such as the Internet, mobile network, or any other type of network) via a network interface connection (not shown). The input and output device(s) may be locally or remotely (e.g., via the network (512)) connected to the computer processor(s) (502), memory (504), and storage device(s) (506). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the disclosure. Further, one or more elements of the aforementioned computing system (500) may be located at a remote location and connected to the other elements over a network (512).

Further, embodiments of the disclosure may be implemented on a distributed system having a plurality of nodes, where each portion of the disclosure may be located on a different node within the distributed system. In one embodiment of the disclosure, the node corresponds to a distinct computing device. Alternatively, the node may correspond to a computer processor with associated physical memory. The node may alternatively correspond to a computer processor or micro-core of a computer processor with shared memory and/or resources.

EXAMPLES

The following examples provide scenarios in which methods in accordance with the present disclosure are used to verify compliance with an initial fracturing job design in real-time as the job is executed.

Example 1: Proppant Placement within Fractures

Figure 6:
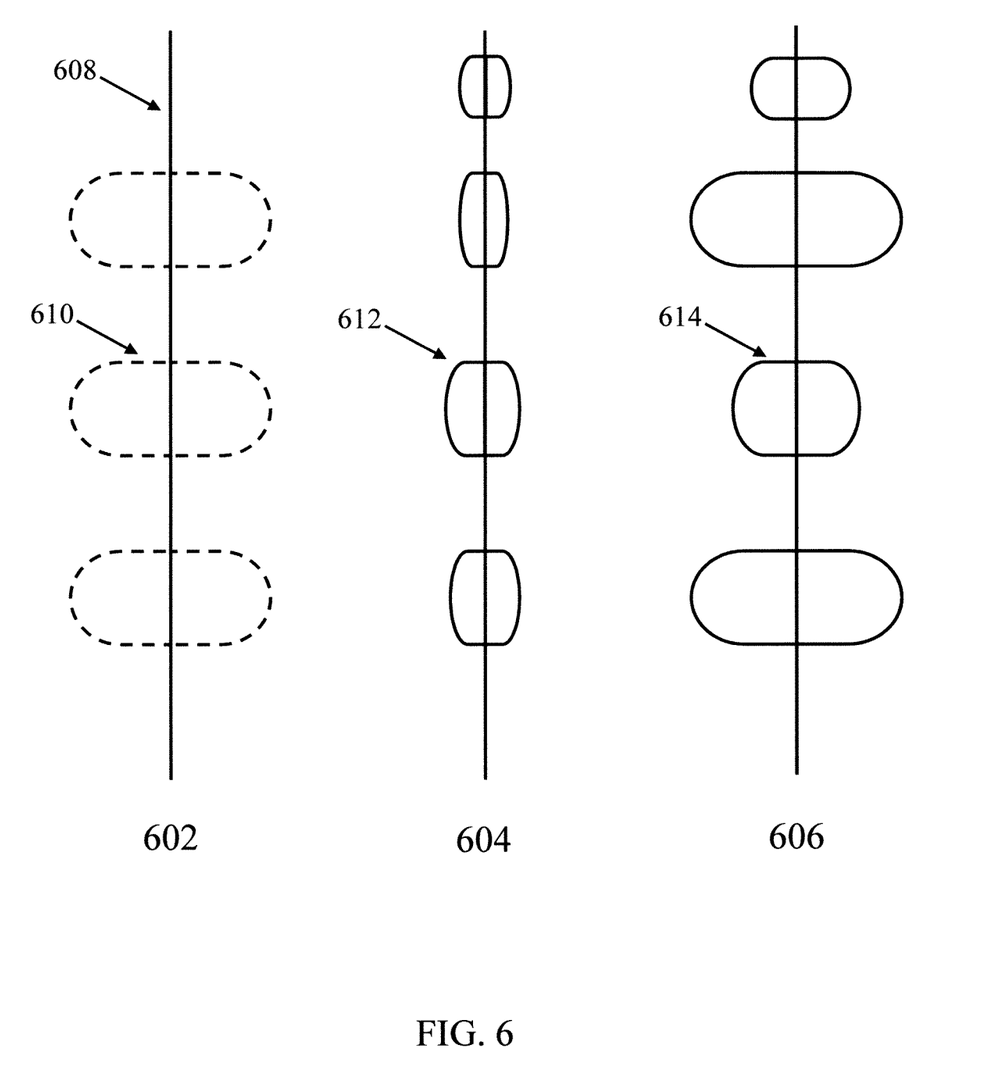
FIG. 6 is a graphical representation of real-time modification of a fracturing job in accordance with embodiments of the present disclosure.

In this example, a method is applied to a job design having the initial criteria of placing 100% of proppant slurry into several induced fractures. With particular respect to FIG. 6, 602 provides an initial job design in which three fractures 610 are induced and filled with a proppant slurry in a selected wellbore interval 608. In the initial job design, the fracturing design criterion is an outcome in which all fractures contain equal amounts of proppant. During execution of hydraulic fracturing design more than planned fractures may be initiated, as shown by the four induced fractures 612 in 604. The creation of additional fractures indicates that a pumping schedule designed for fewer fractures will lead to less fluid injection into the fractures 612, which can result in narrow fracture width due to insufficient proppant placement and/or screen-out.

With particular respect to 606, tube wave analysis during the fracturing job may be used to identify inconsistencies in job execution, such as the presence of unplanned additional fractures 614. Tube wave analysis in accordance with the present disclosure shown in 606 may enable an operator to identify issues in real-time and conduct one of a number of possible remediation actions to increase pumping rate to avoid screen-out. Another possible remediation action is to pump a diversion material to block the propagation of one fracture and to continue stimulation of the remaining fractures.

Example 2: Control of Induced Fracture Length

Figure 7:
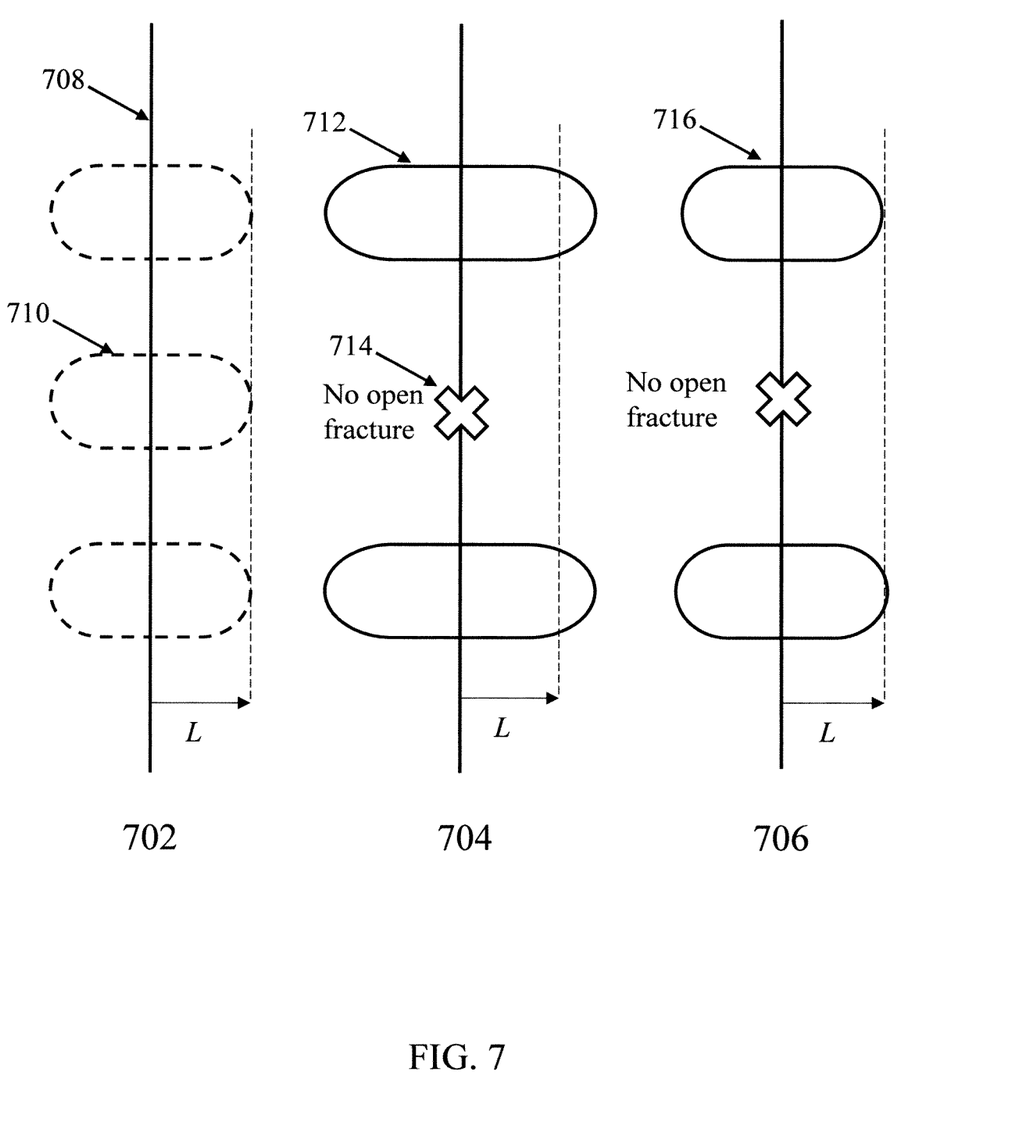
FIG. 7 is a graphical representation of real-time modification of a fracturing job in accordance with embodiments of the present disclosure.

In the next example, methods in accordance with the present disclosure are used to design a fracturing job to produce fractures in a wellbore interval with given length L or shorter as the fracturing job criterion. With particular respect to FIG. 7, 702 is an illustration a job design in which three fractures 710 having length L are planned in a wellbore 708 downhole (initial job design). During the job execution shown in 704, one or more planned fractures 714 may not be initiated (fracturing failure). The remaining fractures 712 will then receive more proppant slurry and the final fracture length will be greater than the planned length L. Uncontrolled fracture propagation can lead to a number of complications including penetration into neighboring wells and the generation of undesired frac-hits (convergence of fractures from different wells).

By identifying the absence of intended fractures through tube wave analysis (here—two open fractures instead three open fractures as per job plan), methods in accordance with the present disclosure may avoid extension of stimulated fractures beyond planned limits through remediation and intervention as shown in 706. For example, remediation in 706 may be performed by reducing proppant slurry volume as described by Eq. 8, where $V_{initial}$ is the initial slurry volume to be pumped downhole; $n_{frac}$, initial is the expected number of fracture before the job started; $n_{frac,actual}$ is the number of fracture from tube waves analysis; $V_{adjusted}$ is the adjusted slurry volume to be pumped downhole.

$$V_{adjusted} = V_{initial} \frac{n_{frac,actual}}{n_{frac,initial}} \quad (8)$$

As shown in 706, the tube wave analysis in real-time during a fracturing job may indicate that the fracture design should be modified (on-line) by reducing injected amount to adjust the final fracture length 716 to match values for L designated in the initial fracture design.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method for treating of subterranean formation, comprising:
   (1) selecting a wellbore for a multilayer hydraulic fracturing treatment, creating an initial job design for the multilayer hydraulic fracturing treatment, setting one or more fracturing job criterion, and generating a model of tube wave propagation in the wellbore based on the initial job design;
   (2) initiating a portion of the initial job design;
   (3) generating one or more tube waves in the wellbore and monitoring one or more reflections of the one or more tube waves, and calculating a number of open fractures and fracture geometry parameters with the model of tube wave propagation;
   (4) performing real-time evaluation of the fracture geometry parameters by:
   estimating one or more pumping flow rates into the number of open fractures; and simulating a fracturing process for the number of open fractures using a multilayer fracturing simulator;
   (5) adjusting of the parameters of the multilayer fracturing simulator until the number of open fractures, one or more pumping flow rates, and fracture geometry parameters from stage (3) coincide with the real-time evaluation of the fracture geometry parameters from stage (4) to generate an adjusted hydraulic fracturing simulator;
   (6) calculating the fracture geometry parameters with the adjusted hydraulic fracturing simulator to generate a measured job design;
   (7) calculating the difference between the fracturing criterion of the initial job design and the measured job design; and
   (8) performing one of:
   verifying that the difference from stage (7) is below an assigned variance for the one or more fracturing job criterion and continuing the initial job design; or
   updating the initial job design and repeating stages (6) and (7) until the difference from stage (7) is below the assigned variance for the one or more fracturing job criterion and continuing with an update of the initial job design; and
   (9) repeating stages (3) to (8) until the multilayer hydraulic fracturing treatment is completed.

2. The method of claim 1, wherein the model for tube wave propagation comprises a parameter of wellbore reflectivity.

3. The method of claim 1, wherein the fracturing job criterion is the total amount of proppant placed into all fractures.

4. The method of claim 1, wherein a number of stimulated fractures in the multilayer hydraulic fracturing treatment differs from the initial job design.

5. The method of claim 1, wherein the fracturing job criterion is a specific amount of proppant in each fracture.

6. The method of claim 1, wherein the model of tube wave propagation determines a number of open fractures in the wellbore and one or more fracture geometry parameters selected from a group: fracture depth, fracture length, width, and height.

7. The method of claim 1, wherein the monitoring of reflected tube waves is performed by a pressure sensor at the wellhead of the wellbore or by one or more distributed pressure sensors in the wellbore.

8. The method of claim 1, wherein real-time evaluation is performed through modeling a slurry flow into the wellbore to calculate the flow rate distribution among multiple fractures.

9. The method of claim 1, wherein simulating a fracturing process for the number of open fractures using a multilayer fracturing simulator comprises evaluating one or more fracture geometry parameters.

10. The method of claim 1, wherein adjusting the multilayer fracturing simulator comprises adjusting one or more job parameters selected from a group consisting of: pumping flow rate, proppant concentration, proppant size, fiber additives, fluid type, and fluid additives amount.

* * * * *